(12) United States Patent
Lin

(10) Patent No.: US 6,942,732 B2
(45) Date of Patent: Sep. 13, 2005

(54) METHOD FOR FORMING DOUBLE DENSITY WORDLINE

(75) Inventor: Chun-Jung Lin, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 130 days.

(21) Appl. No.: 10/664,149

(22) Filed: Sep. 17, 2003

(65) Prior Publication Data

US 2004/0241993 A1 Dec. 2, 2004

(30) Foreign Application Priority Data

May 29, 2003 (TW) ........................................ 92114546 A

(51) Int. Cl.[7] .............................................. C30B 23/00
(52) U.S. Cl. .................... 117/97; 117/2; 117/3; 117/89; 117/94; 117/95
(58) Field of Search ........................... 117/2, 3, 89, 94, 117/95, 97

(56) References Cited

U.S. PATENT DOCUMENTS 6,548,841 B2 * 4/2003 Frazier et al. .............. 257/254
6,803,840 B2 * 10/2004 Hunt et al. ................. 333/186
6,809,465 B2 * 10/2004 Jin ............................. 313/310

* cited by examiner

Primary Examiner—Felisa Hiteshew
(74) Attorney, Agent, or Firm—Birch, Stewart, Kolasch & Birch, LLP

(57) ABSTRACT

A method for forming a double density wordline. A semiconductor substrate having a poly layer, a first insulating layer, a first dummy poly layer, and a second insulating layer is provided. The second insulating layer and the first dummy poly layer separated by an opening are a first wordline mask and a second wordline mask respectively. A spacer is formed on a sidewall of the opening, and the opening is filled with a second dummy poly layer. The spacer, the second insulating layer, and the exposed first insulating layer are removed to form a third wordline mask, the third wordline is composed of the second dummy poly layer and the unexposed first insulating layer. The poly layer is etched to form a first wordline, a second wordline, and a third wordline using the first wordline mask, the second wordline mask, and the third wordline mask as etching masks.

24 Claims, 5 Drawing Sheets

METHOD FOR FORMING DOUBLE DENSITY WORDLINE

This nonprovisional application claims priority under 35 U.S.C. §119(a) on Patent Application No(s). 92114546 filed in TAIWAN, R.O.C. on May 29, 2003, which is(are) hereirn incorporated by reference.

BACKGROUND OF THE INVENTION

1. Field of the Invention

The invention relates to an EEPROM process, and more particularly to a method to increase wordline density by reducing wordline widths of and space therebetween.

2. Description of the Related Art

Digital information is stored in a memory cell wherein the memory cell acts as a single digital bit. Hence, a plurality of digital bits is stored in a plurality of memory cells. The memory cells are arranged be array, and each memory cell is set at predetermined address by column and row. The memory cells in the same column or row are strung together with the same conducting wire which is called a wordline.

FIGS. 1a to 1b are cross-sections of the conventional method for forming wordlines of an EEPROM.

In FIG. 1a, a semiconductor substrate 101 is provided, and a plurality of memory cells and other elements can be formed thereon. A poly layer 102, a WSi layer 103, a patterned photoresist layer 104 with an opening 105 are sequentially formed in the semiconductor substrate 101. The width of the opening 105 is 0.18 µm, and a portion of the surface of the WSi layer 103 is exposed by the opening 105.

In FIG. 1b, the WSi layer 103 and the poly layer 102 are anisotropically etched using the patterned photoresist layer 104 as an etching mask until the semiconductor substrate 101 is exposed to form an opening 106. After the photoresist layer 104 is removed, wordlines 107a and 107b are formed and separated by the opening 106. The widths of the wordlines 107a and 107b are both 0.14 µm. The size of the opening 106 matches the size of the opening 105 of the patterned photoresist layer 104.

Due to the restrictions of the characteristics of the light source and the photoresist layer, an insufficiently thick photoresist layer with cannot effectively isolate the etching source. Conversely, when an excessively thick photoresist layer is used, the size of the contact window is difficult to control. Possible collapse of the photoresist layer should also be prevented.

SUMMARY OF THE INVENTION

The present invention provides a method for forming a wordline of an EEPROM by an additional wordline mask to reduce wordline widths and the space therebetween.

Accordingly, the present invention provides a method for forming a double density wordline. A semiconductor substrate is provided. A poly layer, a first insulating layer, a first sacrificial layer, a second insulating layer, and a photoresist layer with a wordline pattern are sequentially formed thereon, and a portion of the second insulating layer is exposed by the wordline pattern. The insulating layer and the first sacrificial layer are sequentially etched using the photoresist layer as an etching mask until the first insulating layer is exposed to form a first word line mask, a second wordline mask, and an opening therebetween. The photoresist layer is removed. A spacer is formed on a sidewall of the opening. The opening is filled with a second sacrificial layer. The spacer, the second insulating layer, and the first insulating layer under the spacer to form a third wordline mask composed of the second sacrificial layer and the first insulating layer thereunder. The poly layer is etched using the first wordline mask, the second wordline mask, and the third wordline mask as etching masks to form a first wordline, a second wordline, and a third wordline.

Accordingly, the present invention also provides a method for forming a double density wordline. A semiconductor substrate with a poly layer, a silicide layer, an oxide layer, a first dummy poly layer, and a first nitride layer is provided. A patterned photoresist layer with a first opening is formed on the first nitride layer, and a portion of the first nitride layer is exposed by the first opening. The first nitride and the first dummy poly layer are sequentially etched until the oxide layer is exposed to form a first wordline mask, a second wordline mask, and a second opening therebetween. The patterned photoresist layer is removed. A second nitride layer is conformably formed to cover the first wordline mask, the second wordline mask, and the second opening. The second nitride layer is anisotropically etched to form a spacer on a sidewall of the second opening. A second dummy poly layer is formed cover the first wordline mask, the second wordline mask, and the second opening, and the second opening is filled with the second dummy poly layer. The second dummy poly layer is etched to a level below the spacer. After the spacer, the first nitride layer, and the exposed oxide layer are removed, a third wordline mask is composed of the second dummy poly layer and the oxide layer thereunder. The silicide layer and the poly layer are sequentially etched using the first wordline mask, the second wordline mask, and the third wordline mask as etching masks to form a first wordline, a second wordline, and a third wordline.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2h are cross-sections of the method for forming double density wordline of an EEPROM of the present invention.

Figure 1A:
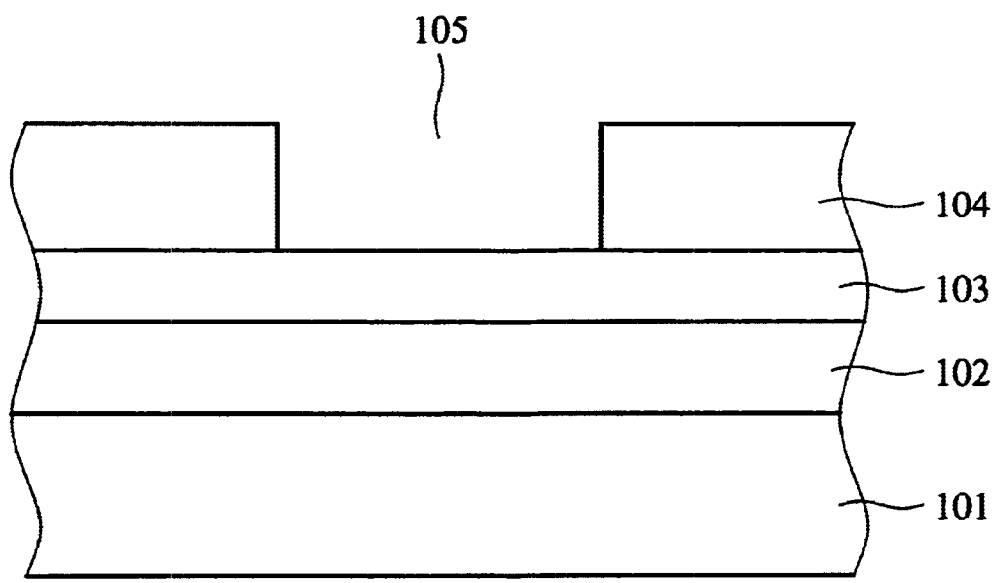
FIGS. 1a to 1b are cross-sections of the conventional method for forming wordlines of an EEPROM.
Figure 1B:
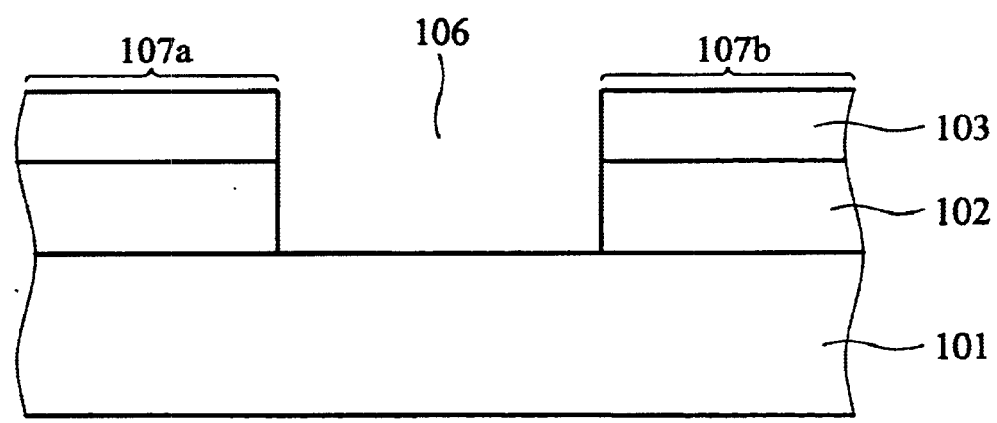
Figure 2A:
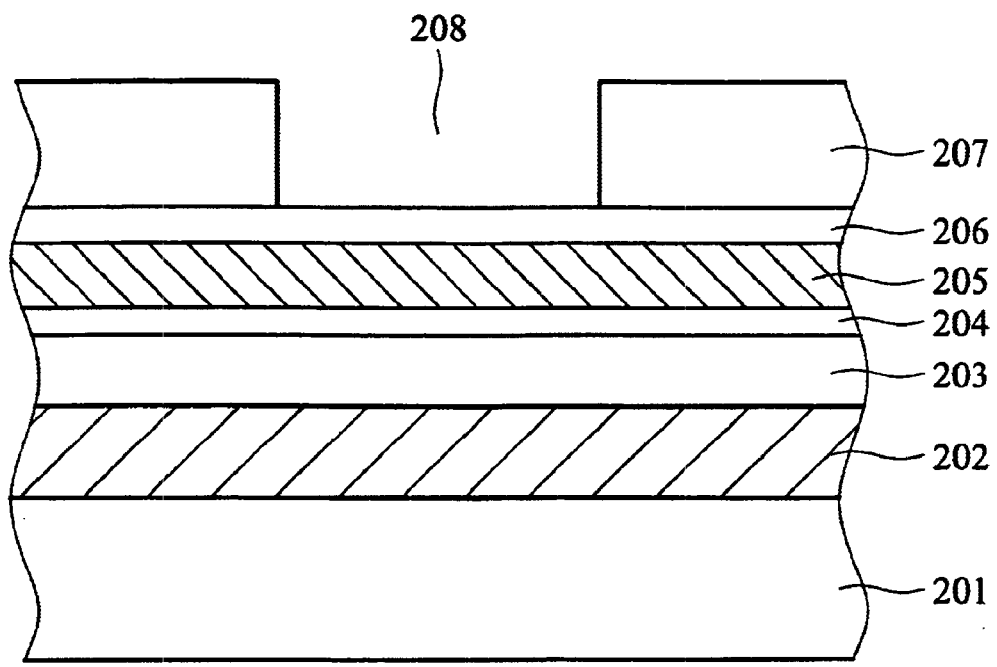
FIGS. 2a to 2h are cross-sections of the method for forming the double density wordline of an EEPROM of the present invention.

In FIG. 2a, a semiconductor substrate 201 is provided, a plurality of memory cells and other elements can be formed thereon.

A poly layer 202, a metal layer 203, an insulating layer 204, a first dummy poly layer 205 acting as a sacrificial layer, a insulating layer 206, and a patterned photoresist layer 207 with an opening 208 are sequentially formed on the semiconductor substrate 201, and a portion of the insulating layer 206 is exposed by the opening 208. The thickness of the poly layer 202 is about 1150 to 1250 Å. The metal layer 203 can be a silicide layer, such as a WSi layer, and the thickness of the WSi layer is about 1550 to 1650 Å. The thickness of the insulating layer 204, such as silicon oxide layer, is about 750 to 850 Å. The thickness of the first dummy poly layer is about 950 to 1050 Å. The thickness of the insulating layer 206, such as silicon nitride layer, is about 250 to 350 Å. The material of the insulating layer 206 is different from the insulating layer 204. The width of the opening 208 is 0.18 μm.

Figure 2B:
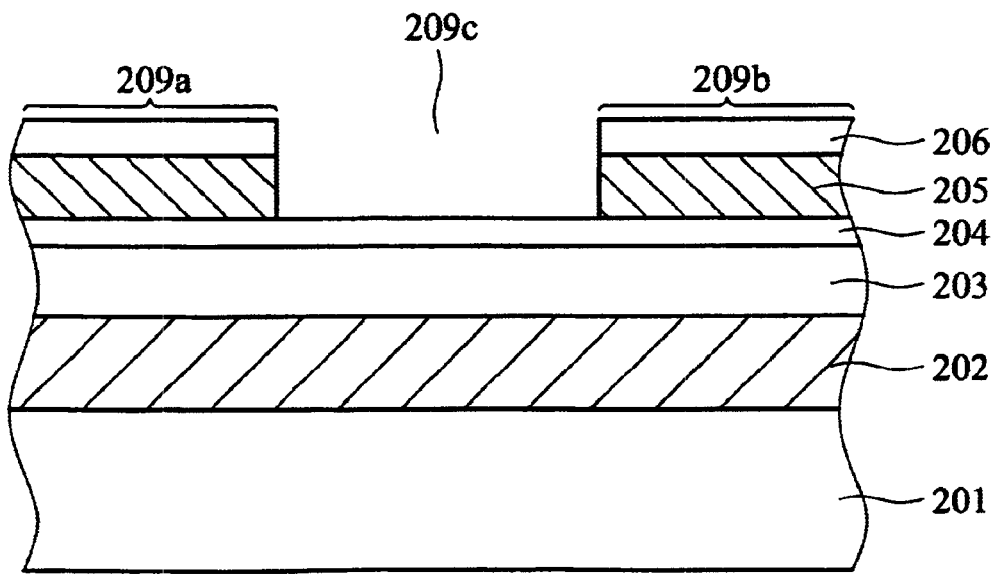

In FIG. 2b, the insulating layer 206 and the first dummy poly layer 205 are anisotropically etched by reactive ion etching or plasma etching until the insulating layer 204 is exposed to form a first wordline mask 209a, a second wordline mask 209b, and an opening 209c in between. A width of the first wordline mask 209a and the second wordline mask 209b are both 0.14 μm.

Figure 2C:
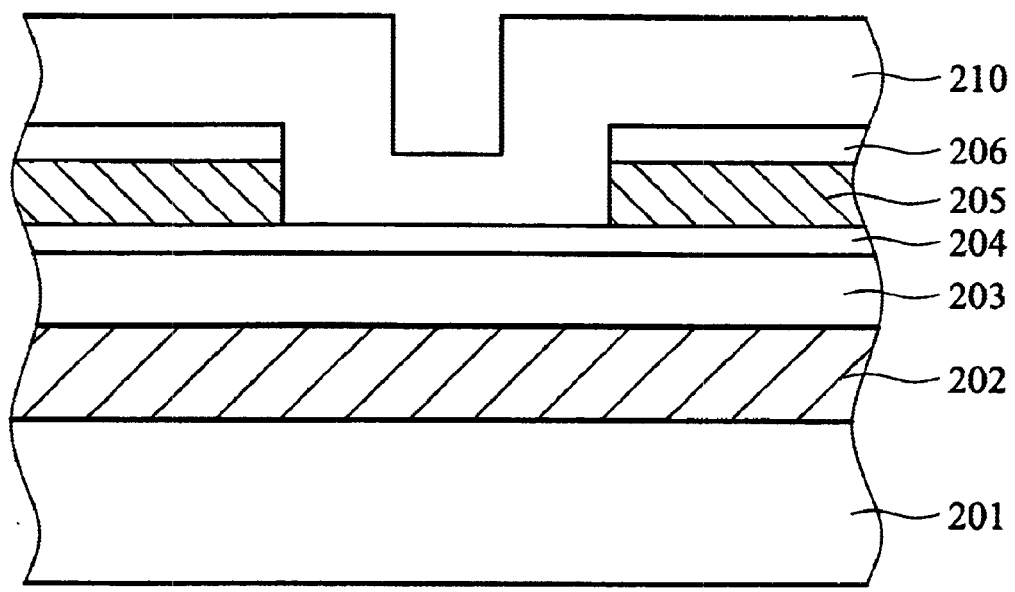

In FIG. 2c, a insulating layer 210 is conformably formed to cover the first wordline mask 209a, the second wordline mask 209b, and the opening 209c. The thickness of the insulating layer 210, such as the nitride layer, is 200 Å, and the material of the insulating layer 210 is the same as the insulating layer 206.

Figure 2D:
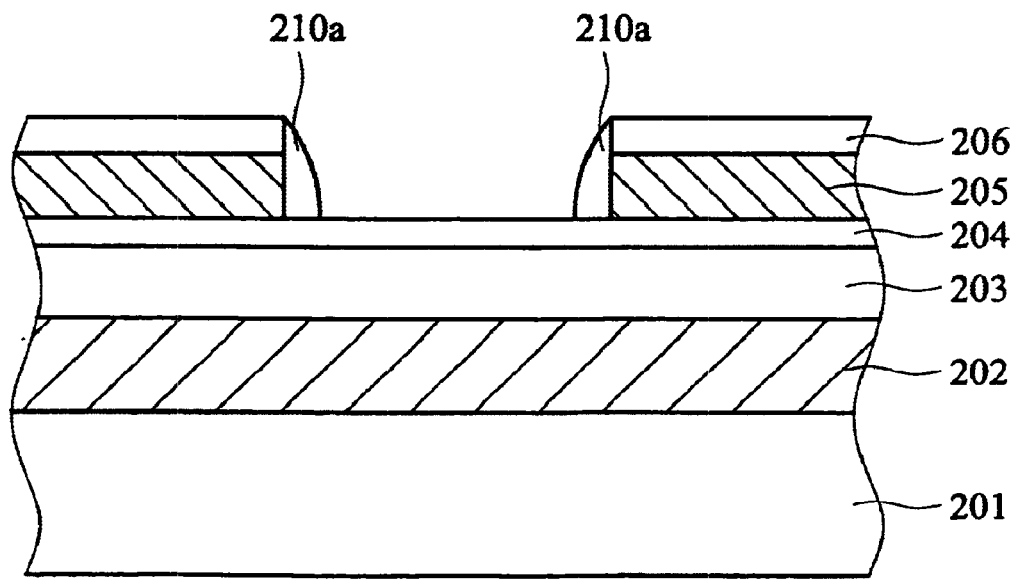

In FIG. 2d, the insulating layer 210 is anisotropically etched by reactive ion etching or plasma etching until the insulating layer 204 is exposed to form a spacer 210a on a sidewall of the opening 209c.

Figure 2E:
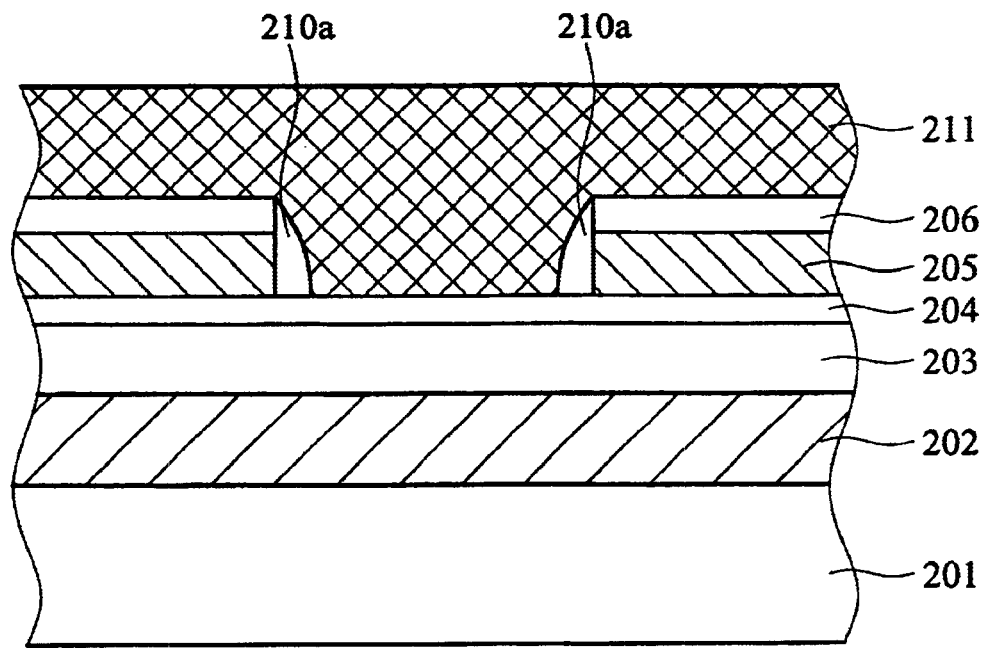

In FIG. 2e, a second dummy poly layer 211 acting as a sacrificial layer is conformably formed to cover the first wordline mask 209a, the second wordline mask layer 209b, and the opening 209c, and the opening 209c is filled with the second dummy poly layer 211. The thickness of the second dummy poly layer is 2000 Å.

Figure 2F:
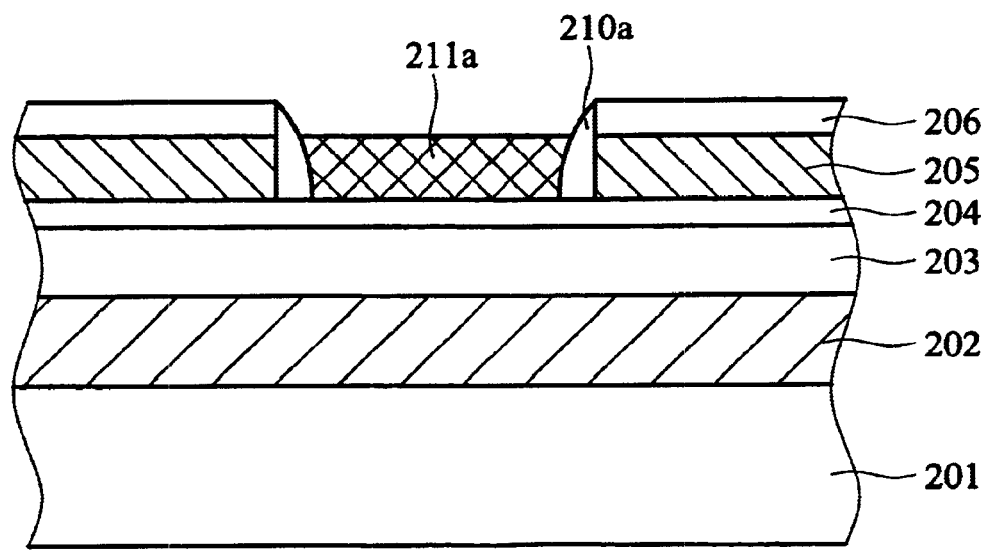

In FIG. 2f, the second dummy poly layer 211 is etched to expose the insulating layer 206 and below than the spacer 210a.

Figure 2G:
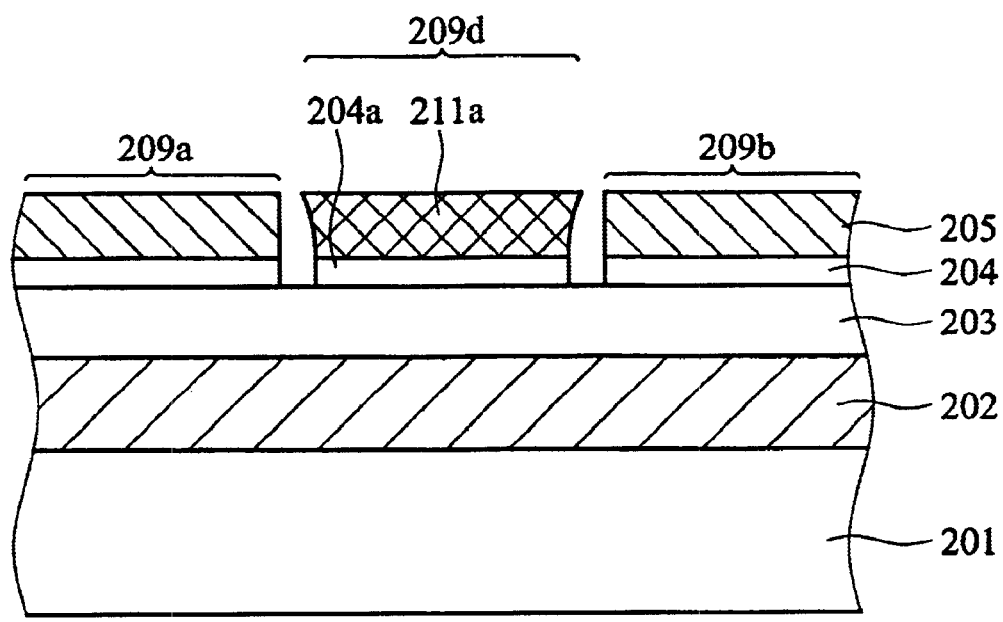

In FIG. 2g, the insulating layer 206, the spacer 210a, and the exposed insulating layer 204 are removed to form a third wordline mask 209d in the opening 209c, the third wordline mask 209d is composed of the second dummy poly layer 211a and the insulating layer 204a. The width of the third wordline mask 209d is 0.14 μm. The first wordline mask 209a, the third wordline mask 209d, and the second wordline mask 209b are disposed apart by a predetermined distance of 200 Å.

Figure 2H:
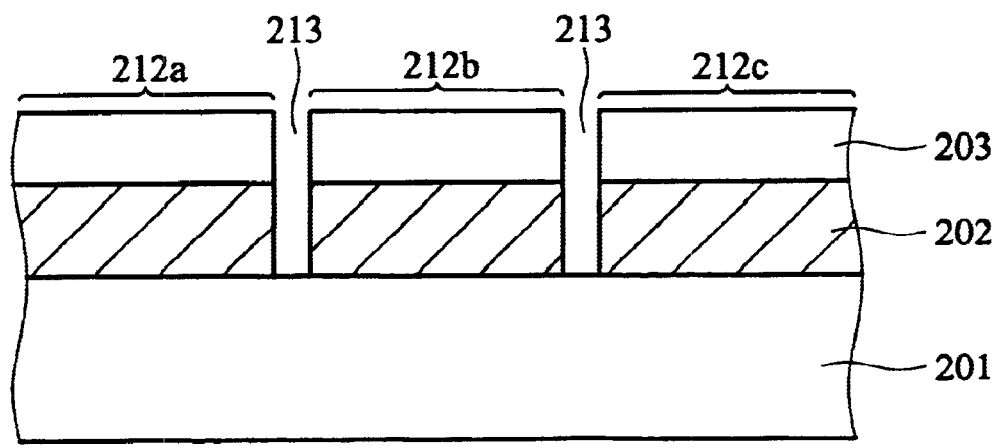

In FIG. 2h, the metal layer 203 and the poly layer 202 are anisotropically etched by reactive ion etching or plasma etching using the first wordline mask 209a, the second wordline mask 209b, and the third wordline mask 209d as etching masks until the semiconductor substrate 201 is exposed to form a first wordline 212a, a second wordline 212b, and a third wordline 212c. The first wordline mask 209a, the second wordline mask 209b, and the third wordline mask 209d are removed.

An additional wordline 212c is formed between the previous wordlines 212a and 212b of the present invention, the space 213 is not limited by the characteristics of the light source and the photoresist layer and a distance is reduced to 200 Å. Therefore, the density of the wordline of the EEPROM is increased While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a double density wordline, comprising:
   providing a semiconductor substrate;
   sequentially forming a poly layer, a first insulating layer, a first sacrificial layer, a second insulating layer, and a photoresist layer with a wordline pattern on the semiconductor substrate;
   sequentially etching the second insulating layer and the first sacrificial layer using the photoresist layer as an etching mask until the first insulating layer is exposed to form a first wordline mask, a second wordline mask, and an opening therebetween;
   removing the photoresist layer;
   forming a spacer on a sidewall of the opening;
   forming a second sacrificial layer in the opening;
   removing the spacer, the second insulating layer, and the first insulating layer under the spacer to form a third wordline mask composed of the second sacrificial layer and the first insulating layer thereunder; and
   etching the poly layer to form a first wordline, a second wordline, and a third wordline using the first wordline mask, the second wordline mask, and the third wordline mask as etching masks.

2. The method for forming a double density wordline of claim 1, further comprising a silicide layer over the surface of the poly layer.

3. The method for forming a double density wordline of claim 2, wherein the silicide layer is a tungsten silicide layer.

4. The method for forming a double density wordline of claim 3, wherein a thickness of the tungsten silicide layer is 1550 to 1650 Å.

5. The method for forming a double density wordline of claim 1, wherein a thickness of the poly layer is 1150 to 1250 Å.

6. The method for forming a double density wordline of claim 1, wherein the first insulating layer is a silicon oxide layer.

7. The method for forming a double density wordline of claim 6, wherein a thickness of the silicon oxide layer is 750 to 850 Å.

8. The method for forming a double density wordline of claim 1, wherein the first sacrificial layer is a poly layer.

9. The method for forming a double density wordline of claim 8, wherein a thickness of the poly layer is 950 to 1050 Å.

10. The method for forming a double density wordline of claim 1, wherein the second insulating layer is a nitride layer.

11. The method for forming a double density wordline of claim 10, wherein a thickness of the nitride layer is 250 to 350 Å.

12. The method for forming a double density wordline of claim 1, wherein the spacer is a nitride layer.

13. The method for forming a double density wordline of claim 1, wherein the second sacrificial layer is a poly layer.

14. A method for forming a double density wordline, comprising:
    providing a semiconductor substrate with a poly layer, a silicide layer, a oxide layer, a first dummy poly layer, and a first nitride layer;
    forming a photoresist layer with a first opening on the nitride layer, wherein a portion of the first nitride layer is exposed by the first opening;
    sequentially etching the fist nitride layer and the first dummy poly layer until the oxide layer is exposed to form a first wordline mask, a second wordline mask, and a second opening therebetween;
    removing the photoresist layer;

conformably forming a second nitride layer cover the first wordline mask, the second wordline mask, and the second opening;

anisotropically etching the second nitride layer to form a spacer on a sidewall of the second opening;

forming a second dummy poly layer cover the first wordline mask, the second wordline mask, and the second opening, wherein the second opening is filled with the second dummy poly layer;

etching the second dummy poly layer to a level below the spacer;

removing the spacer, the first nitride layer, and the exposing oxide layer to form a third wordline mask composes of the second dummy poly layer and the oxide thereunder; and sequentially etching the silicide layer and the poly layer to form a first wordline, a second wordline, a third wordline using the first wordline mask, the second wordline mask, and the third wordline mask as etching masks.

15. The method for forming a double density wordline of claim 14, further comprising a step to remove the first wordline mask, the second wordline mask, and the third wordline mask.

16. The method for forming a double density wordline of claim 14, wherein a thickness of the poly layer is 1150 to 1250 Å.

17. The method for forming a double density wordline of claim 14, wherein the silicide layer is a tungsten silicide layer.

18. The method for forming a double density wordline of claim 17, wherein a thickness of the tungsten silicide layer is 1550 to 1650 Å.

19. The method for forming a double density wordline of claim 14, wherein a thickness of the oxide layer is 750 to 850 Å.

20. The method for forming a double density wordline of claim 14, wherein a thickness of the first dummy poly layer is 950 to 1050 Å.

21. The method for forming a double density wordline of claim 14, wherein a thickness of the first nitride layer is 250 to 350 Å.

22. The method for forming a double density wordline of claim 14, wherein a thickness of the second nitride layer is 400 Å.

23. The method for forming a double density wordline of claim 14, wherein the anisotropic etching is reactive ion etching or plasma etching.

24. The method for forming a double density wordline of claim 14, wherein a thickness of the second dummy poly layer is 2000 Å.

* * * * *